(12) United States Patent
Bayless et al.

(10) Patent No.: US 11,239,129 B2
(45) Date of Patent: Feb. 1, 2022

(54) PACKAGE COOLING BY COIL CAVITY

(71) Applicant: Micron Technology, Inc., Boise, ID (US)

(72) Inventors: Andrew M. Bayless, Boise, ID (US); Wayne H. Huang, Boise, ID (US); Owen R. Fay, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/006,740

(22) Filed: Aug. 28, 2020

(65) Prior Publication Data

US 2020/0395258 A1 Dec. 17, 2020

Related U.S. Application Data

(63) Continuation of application No. 16/237,111, filed on Dec. 31, 2018, now Pat. No. 10,763,186.

(51) Int. Cl.
*H01L 23/31* (2006.01)
*H01L 23/473* (2006.01)
(Continued)

(52) U.S. Cl.
CPC ............ *H01L 23/315* (2013.01); *H01L 21/56* (2013.01); *H01L 23/36* (2013.01); *H01L 23/467* (2013.01); *H01L 23/473* (2013.01)

(58) Field of Classification Search
CPC ..... H01L 23/315; H01L 23/36; H01L 23/467; H01L 23/473; H01L 23/46; H01L 23/42;
(Continued)

(56) References Cited

U.S. PATENT DOCUMENTS 5,210,440 A * 5/1993 Long .................... H01L 23/473
257/675
6,351,384 B1 * 2/2002 Daikoku .................. F28F 3/02
165/80.3
(Continued)

FOREIGN PATENT DOCUMENTS

WO 2017218290 A1 12/2017

OTHER PUBLICATIONS

KR Patent Application No. 10-2019-0172798—Korean Office Action and Search Report, dated May 1, 2021, with English Translation, 15 pages.
(Continued)

*Primary Examiner* — Dao H Nguyen
(74) *Attorney, Agent, or Firm* — Perkins Coie LLP

(57) ABSTRACT

A semiconductor device assembly can include a first die package comprising a bottom side; a top side; and lateral sides extending between the top and bottom sides. The assembly can include an encapsulant material encapsulating the first die package. In some embodiments, the assembly includes a cooling cavity in the encapsulant material. The cooling cavity can have a first opening; a second opening; and an elongate channel extending from the first opening to the second opening. In some embodiments, the elongate channel surrounds at least two of the lateral sides of the first die package. In some embodiments, the elongate channel is configured to accommodate a cooling fluid.

19 Claims, 16 Drawing Sheets

(51) Int. Cl.
*H01L 21/56* (2006.01)
*H01L 23/36* (2006.01)
*H01L 23/467* (2006.01)

(58) Field of Classification Search
CPC . H01L 23/3114; H01L 23/3677; H01L 23/31; H01L 21/56; H01L 21/568; H01L 25/0657
USPC ........ 438/107, 109, 675; 257/712, 713, 714, 257/717, 678, 686, 692, E21.499, 257/E21.586, E21.705, E23.011, E23.023, 257/E23.051, E23.062, E23.088, E23.094, 257/E25.013; 361/699, 718, 719, 790, 361/791
See application file for complete search history.

(56) References Cited

U.S. PATENT DOCUMENTS

| | | | |
|---|---|---|---|
| 7,952,191 B2 * | 5/2011 | Sunohara | H01L 23/473 257/712 |
| 7,990,711 B1 * | 8/2011 | Andry | H01L 25/0657 361/699 |
| 8,659,898 B2 | 2/2014 | Brunschwiler et al. | |
| 8,860,212 B1 * | 10/2014 | Foong | H01L 23/473 257/714 |
| 9,449,896 B2 | 9/2016 | Lhostis et al. | |
| 9,646,924 B2 * | 5/2017 | Sakaguchi | H01L 23/473 |
| 2004/0251530 A1 | 12/2004 | Yamaji | |
| 2006/0278978 A1 * | 12/2006 | Woerner | B01L 3/502707 257/730 |
| 2008/0150162 A1 * | 6/2008 | Koizumi | H01L 23/473 257/778 |
| 2010/0187682 A1 * | 7/2010 | Pinjala | H01L 23/473 257/713 |
| 2011/0205708 A1 | 8/2011 | Andry et al. | |
| 2012/0001341 A1 | 1/2012 | Ide et al. | |
| 2013/0099368 A1 | 4/2013 | Han et al. | |
| 2014/0015119 A1 | 1/2014 | Bonkohara | |
| 2014/0209285 A1 * | 7/2014 | Hoshino | H01L 21/4882 165/166 |
| 2019/0122959 A1 | 4/2019 | Chen et al. | |
| 2019/0131211 A1 * | 5/2019 | Kearney | H05K 1/0272 |
| 2020/0118840 A1 * | 4/2020 | Beyne | H01L 21/568 |

OTHER PUBLICATIONS

KR Patent Application No. 10-2019-0172798—Korean Office Action, dated Nov. 25, 2021, with English Translation, 9 pages.

* cited by examiner

PACKAGE COOLING BY COIL CAVITY

CROSS-REFERENCE TO RELATED APPLICATION(S)

This application is a continuation of U.S. application Ser. No. 16/237,111, filed Dec. 31, 2018; which is incorporated herein by reference in its entirety.

TECHNICAL FIELD

The present technology generally relates to semiconductor device assemblies, and in some embodiments more particularly to semiconductor device assemblies having cooling channels.

BACKGROUND

Packaged semiconductor dies, including memory chips, microprocessor chips, imager chips, and central processing units, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry.

Semiconductor manufacturers continually reduce the size of die packages and other semiconductor components to fit within the space constraints of electronic devices, while also increasing the functional capacity of each package to meet operating parameters. One approach for increasing the processing power of a semiconductor package without substantially increasing the surface area covered by the package (i.e., the package's "footprint") is to vertically stack multiple semiconductor dies on top of one another in a single package. The dies in such vertically-stacked packages can be interconnected by electrically coupling the bond pads of the individual dies with the bond pads of adjacent dies using through-silicon vias (TSVs). In vertically stacked packages, the heat generated is difficult to dissipate, which increases the operating temperatures of the individual dies, the junctions therebetween, and the package as a whole. Another approach for increasing processor power while decreasing overall assembly size is to move die packages and other semiconductor devices closer to each other. In such applications, heat from adjacent packages can increase the overall operating temperature of each die package. These size-reduction efforts can cause the die packages to reach temperatures above their maximum operating temperatures in many types of device.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1:
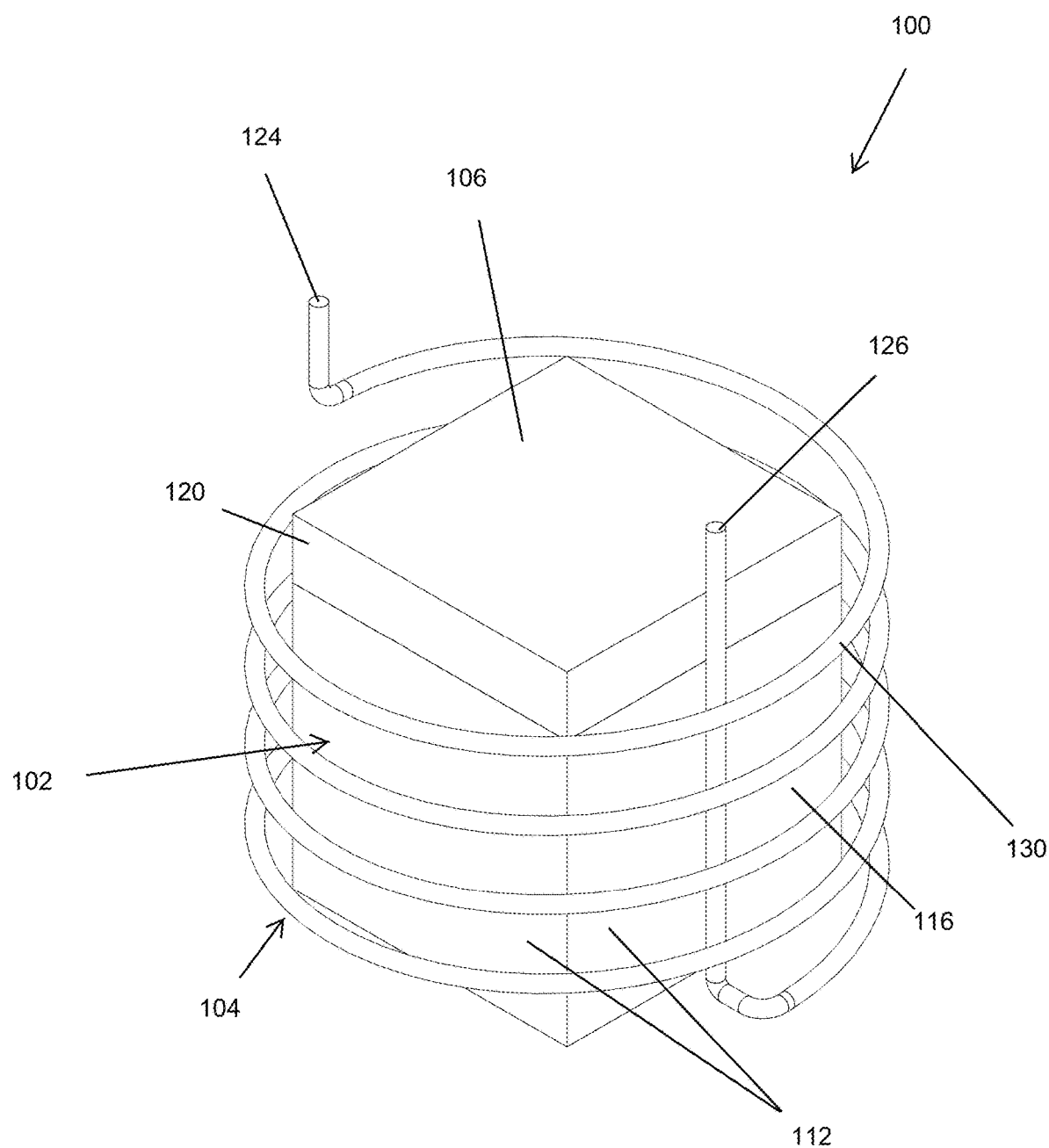
FIG. 1 is a perspective view of an embodiment of a die package assembly.

Specific details of several embodiments of semiconductor device assemblies having a cooling channel formed in an encapsulant (e.g., overmold) of a package casing are described below. The term "semiconductor device" generally refers to a solid-state device that includes one or more semiconductor materials. Examples of semiconductor devices include logic devices, memory devices, microprocessors, and diodes among others. Furthermore, the term "semiconductor device" can refer to a finished device or to an assembly or other structure at various stages of processing before becoming a finished device. Depending upon the context in which it is used, the term "substrate" can refer to a wafer-level substrate or to a singulated, die-level substrate. A person having ordinary skill in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Many embodiments of the present technology are described below in the context of formation of cooling cavities within a semiconductor device. A person having ordinary skill in the relevant art will also understand that the present technology may have embodiments for forming more than one cooling passage in a single semiconductor assembly. The present technology may accordingly be practiced without several of the details of the embodiments described herein with reference to FIGS. 1-16. For ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

Several embodiments of the present technology have at least one die package having a bottom side, a top side, and lateral sides extending between the top and bottom sides. An encapsulant material may encapsulate the first die package. A cooling cavity may be formed in the encapsulant material, the cooling cavity having a first opening, a second opening, and an elongate channel extending from the first opening to the second opening. The cooling cavity can be formed by removing a sacrificial member from the encapsulant. The sacrificial member, and resulting cooling cavity, can be sized, shaped, and otherwise designed to facilitate efficient fluid flow through the encapsulant and near the die package(s) to efficiently cool the die package system.

Figure 2:
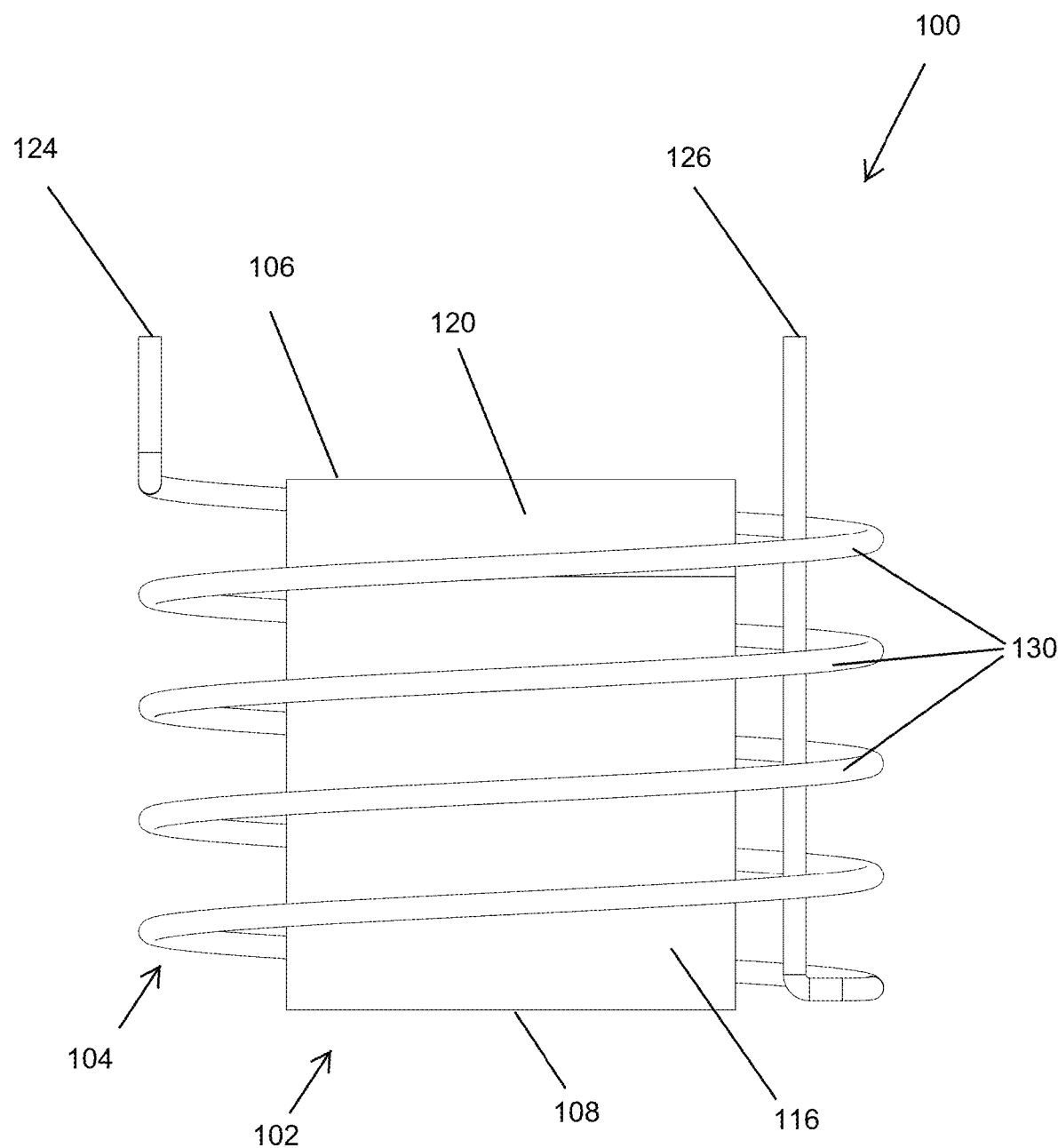
FIG. 2 is a front view of the die package assembly of FIG. 1.
Figure 3:
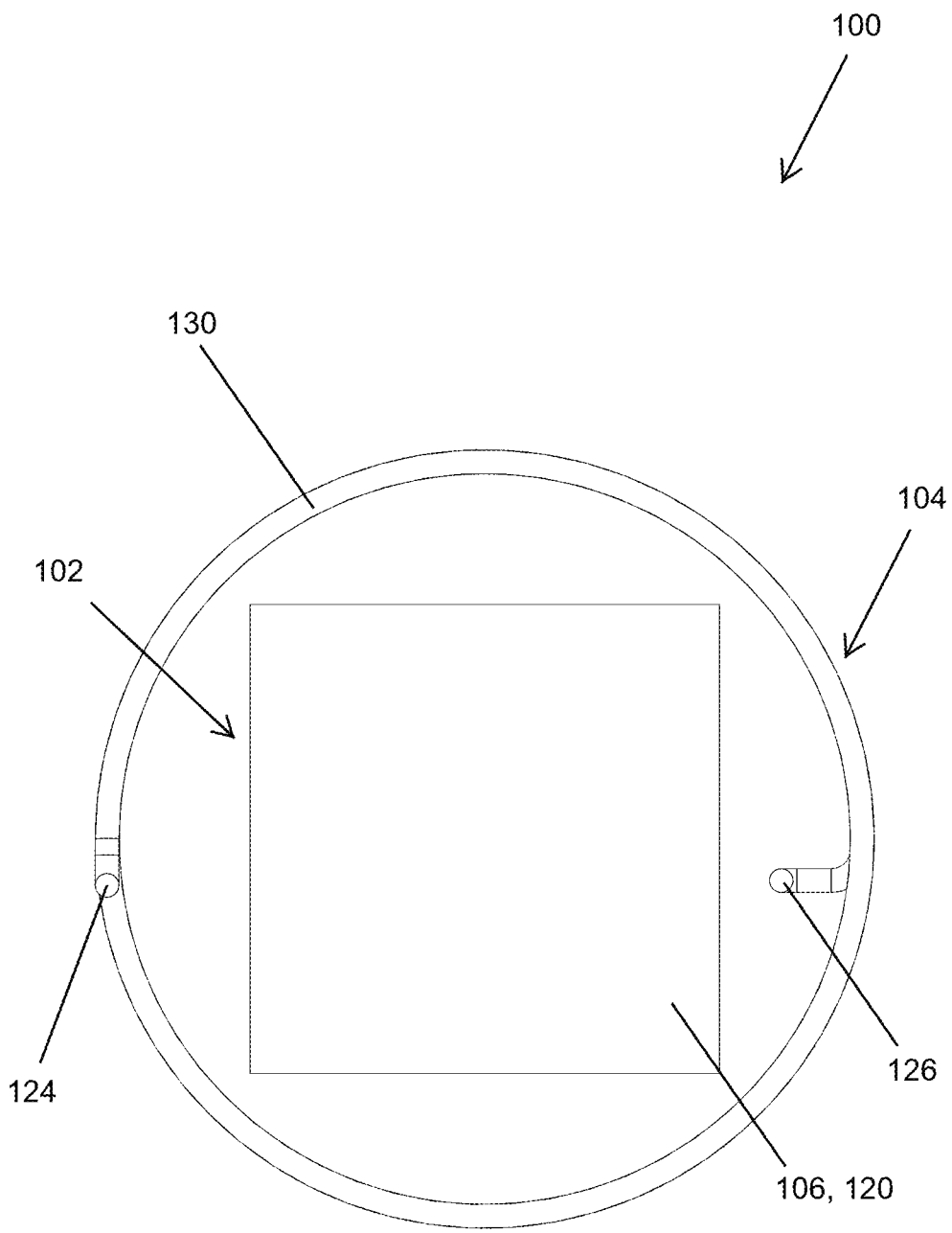
FIG. 3 is a top view of the die package assembly of FIG. 1.

FIGS. 1-3 illustrate an example of a die package assembly 100. The assembly 100 includes a die package 102 and a sacrificial member 104. The die package 102 can be, for example, a CPU, high bandwidth memory (HBM), hybrid memory cube (HMC), fan out package (FOP), or some other die package. The die package 102 can have a top side 106, a bottom side 108 (FIG. 2), and lateral sides 112 extending between the top side 106 and bottom side 108. In the illustrated example, the die packages are rectangular prisms with four lateral sides 112. Other configurations may be employed in the present disclosure. For example, the die package 102 may have a cylindrical, pyramidal, conical, polygonal prism (having three or more lateral sides), and/or other shape.

In some embodiments, the die package assembly 100 includes a body portion 116 and a thermal interface material (TIM) 120 at the top side 106 of the die package 102. The body portion 116 can house the active components of the die package 102. For example, the body portion can include one or more dies, through-silicon vias, active circuitry, mechanical pillars, active pillars, etc. The TIM 120 can be, for example, thermal grease, thermal adhesive, curing thermal grease, non-adhesive thermal glue, a thermally conductive pad, thermal tape, and/or phase-change materials. The TIM 120 can be configured to conduct heat from the body portion 116. The TIM 120 can have a footprint (e.g., the frame of reference of FIG. 3) that is identical to or substantially identical to the footprint of the body portion 116. In some embodiments, the footprint of the TIM is greater than, less than, and/or of a different shape/orientation from the body portion 116.

As illustrated in FIG. 1-3, the sacrificial member 104 can surround some of all of the lateral sides 116 of the die package 102. For example, the sacrificial member 104 can be adjacent two, three, four, or more of the lateral sides 116 of the die package 102. The sacrificial member 104 can have a first end 124 and a second end 126. In some embodiments, the two ends 124, 126 of the sacrificial member 104 are adjacent to each other (e.g., on a same lateral side of the die package 102). In some embodiments, the two ends 124, 126 are on different and/or opposite sides of the die package 102 from each other.

The sacrificial member 104 can extend between the first and second ends 124, 126. For example, the sacrificial member 104 can have a generally helical or coil shape. The sacrificial member 104 can have one or more coils 130 extending around the lateral sides of the die package 102. The sacrificial member 104 can be constructed from one or more of an etchable (e.g., chemically etchable) material, a dissolvable material, a brittle material, a water-soluble material, and/or some other sacrificial material capable of being eliminated when encased in another material. In some embodiments, the sacrificial member 104 has a cross-sectional width (e.g., a diameter when round) that is between 10-60 microns, between 25-200 microns, between 50-150 microns, between 75-175 microns, between 80-120 microns, and/or between 120-250 microns. In some embodiments, the cross-sectional width of the sacrificial member 104 is approximately 15 microns, approximately 100 microns, approximately 150 microns, and/or 200 microns. In some embodiments, the cross-sectional width of the sacrificial member 104 is constant from the first end 124 to the second end 126. In some embodiments, the cross-sectional width of the sacrificial member 104 varies from the first end 124 to the second end 126.

In some embodiments, the sacrificial member 104 is a pre-formed component later positioned near and/or around the die package 102. The sacrificial member 104 can be molded, bent (e.g., as a wire), or otherwise formed into a desired shape. In some embodiments, the sacrificial member 104 has a constant or substantially constant overall width in one or more dimension when observed normal to the top side 106 of the die package (FIG. 3). In some embodiments, the overall width of the sacrificial member 104 varies from the top to the bottom (e.g., up and down in FIG. 2 and/or in a direction normal to the top side 106) of the sacrificial member 104.

Figure 4:
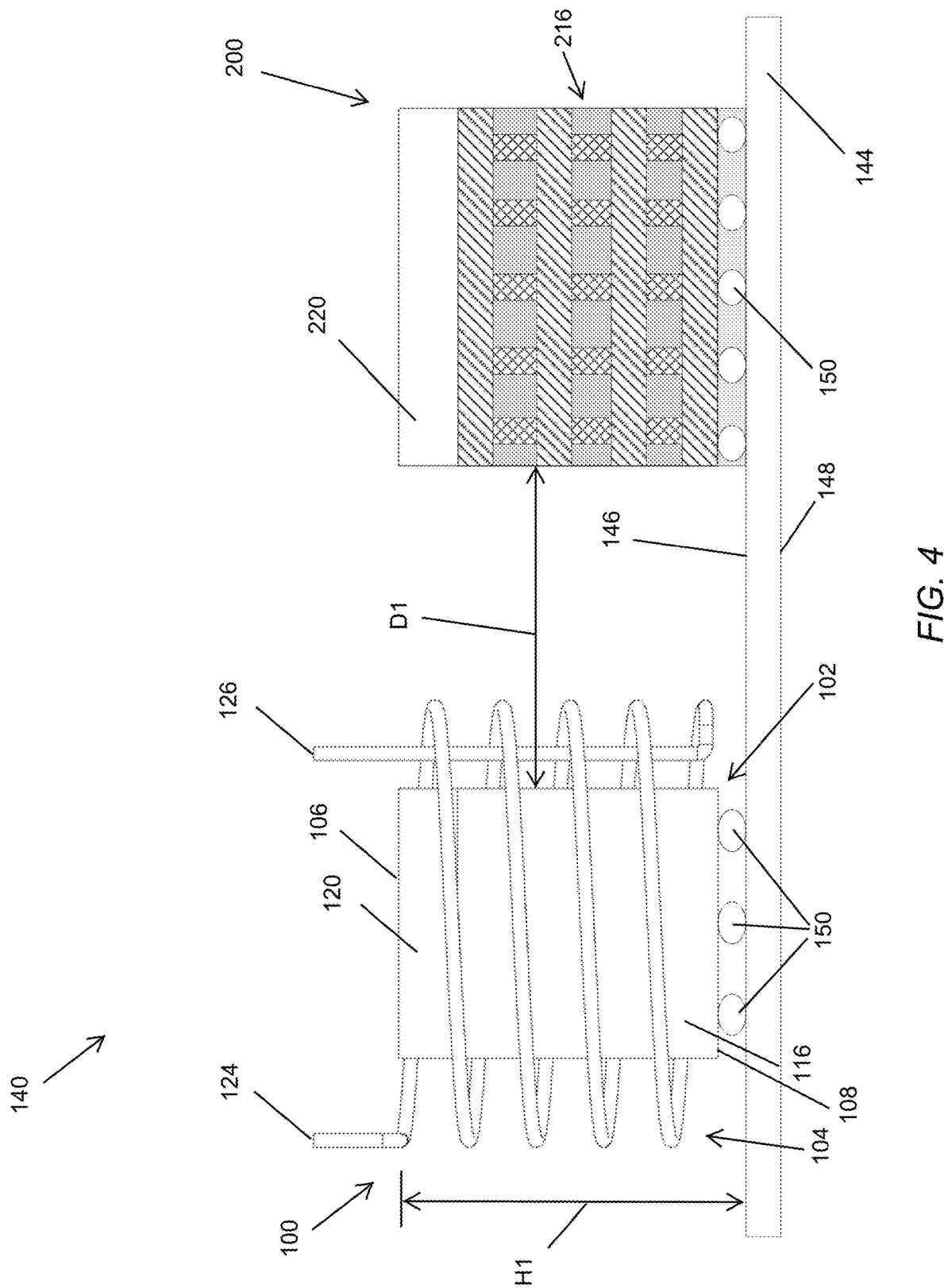
FIG. 4 is a front view of a die package system incorporating the die package assembly of FIG. 1.

FIG. 4 illustrates an embodiment of a die package system 140. The die package system 140 includes the die package assembly 100 of FIGS. 1-3 and a substrate 144. The substrate 144 could be, for example, a wafer (e.g., a silicon or other wafer). In some embodiments, the substrate 144 includes live circuitry. The substrate 144 can include a first surface 146 and a second surface 148 opposite the first surface 146. The first surface 146 of the substrate can include one or more conductive features. For example, the surface can include one or more metal traces, contact pads, or other active features. The die package assembly 100 can be connected to the first surface 146 of the substrate 144. For example, the die package assembly 100 can be connected to the substrate 144 via one or more electrically conductive elements 150 (e.g., copper pillars, solder bumps, and/or other conductive features).

The die package assembly 100 can have a height H1, as measured from either the bottom side of the die package 102 or from the first surface 146 to the top side of the die package 102. The height H1 can be less than 400 microns, less than 500 microns, less than 700 microns, and/or less than 900 microns. In some embodiments, the height H1 of the die package assembly 100 can be between 100-700 microns, between 300-600 microns, between 250-750 microns, and/or between 500-1500 microns. In some embodiments, the height H1 of the die package assembly 100 is approximately 750 microns.

As illustrated in FIG. 4, the die package system 140 can include a second die package assembly 200. The second die package assembly 200 can include a die stack and/or other semiconductor structures. In some embodiments, the second die package assembly 200 includes a body portion 216 and a TIM 200 on the top end of the body portion 216. The second die package 200 can be connected to a substrate (e.g., the same substrate 144 to which the first die package 100 is connected, or another substrate) in a manner the same as, or similar to the way in which the first die package 100 is connected to the substrate 144.

The second die package 202 can be spaced close to the first die package 102. For example, the lateral distance D1 (e.g., the distance as measured parallel to the first surface 146 of the substrate 144) between the first and second die packages 102, 103 can be between 2 mm-8 mm, between 1 mm-11 mm, between 3 mm-7 mm, between 6 mm-12 mm, between 9 mm-11 mm, and/or between 7 mm-20 mm. In some embodiments, the lateral distance D1 between the first and second die packages 102, 103 is between about 5 mm-10 mm.

Figure 5:
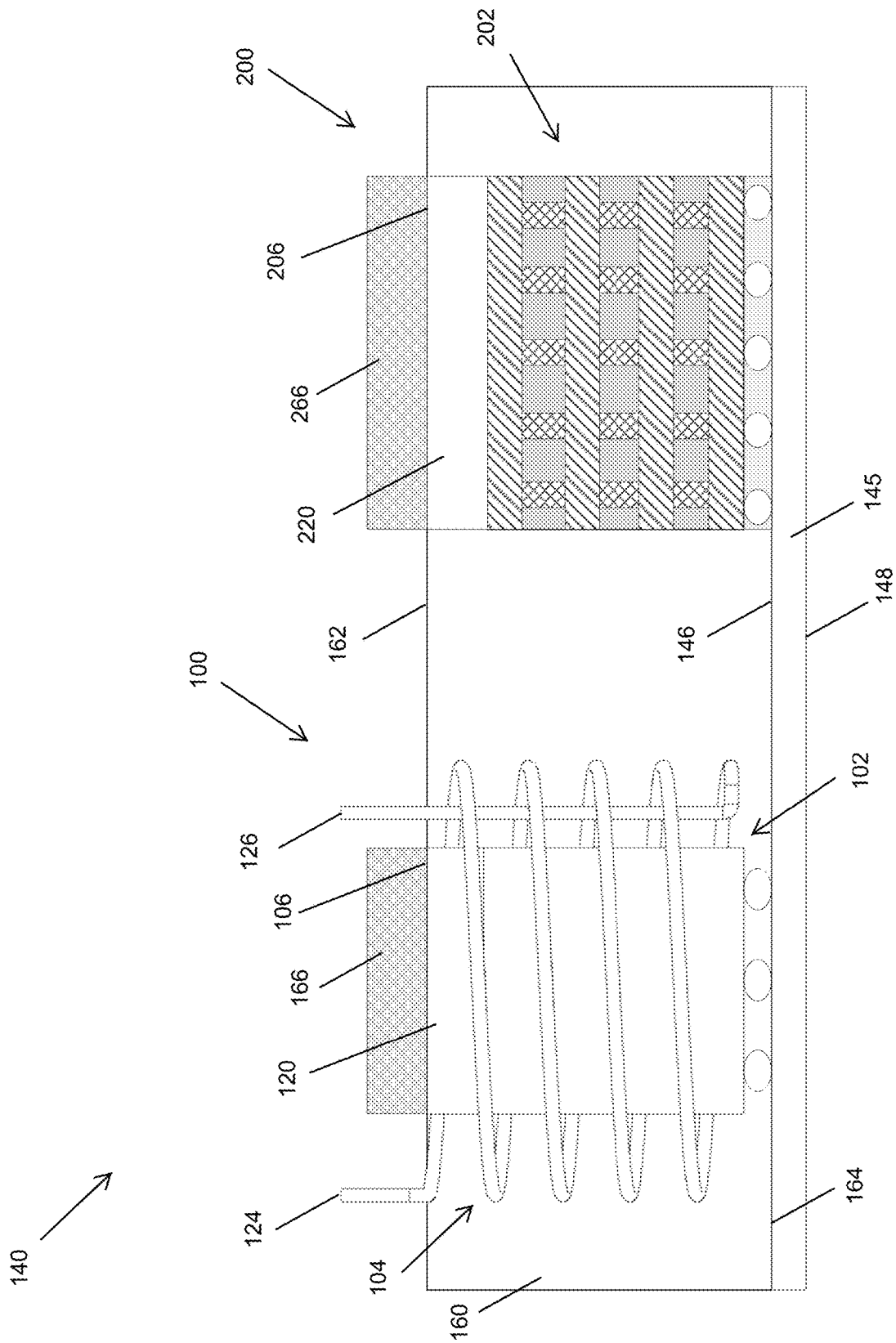
FIG. 5 is a front view of the die package system of FIG. 4, including an encapsulant and illustrating a cavity formed by removal of a sacrificial member.

As illustrated in FIG. 5, the die package system 140 can include an encapsulant 160 (e.g., overmold). The encapsulant 160 is formed after at least one of the die packages 102, 104 are connected to the substrate 144 (and/or to another substrate). The encapsulant 160 can include an upper surface 162 and lower surface 164. The lower surface 164 can be in contact with the first surface 146 of the substrate 144. The encapsulant 160 forms a protective casing that at least partially surrounds the die packages 102, 202. The encapsulant 160 can be sized and shaped to surround all or a majority of the sacrificial member(s) 104. Preferably, at least one of the first and second ends 124, 126 remain outside of the encapsulant 160. The encapsulant 160 can include an epoxy resin or other suitable material that can be molded or shaped to form the casing by transfer molding or compression molding. The encapsulant 160 can include various additives (e.g., coupling agents, cure promoters, silica fillers, such as alumina fillers, etc.) selected to have suitable thermal conductivity, adhesion, chemical resistance, strength, and/or other properties.

In some embodiments, a heat sink 166 is connected to the top side 106 of the first die package 102 (e.g., to a top side of the TIM 120). In some embodiments, a second heat sink 266 is connected to the top side 206 of the second die package 202. The heat sink(s) 166, 266 can be connected to the die package(s) 102, 202 before or after the encapsulant 160 over the die packages 102, 202. The heat sink(s) 166, 266 can be configured to conduct heat away (e.g., upward and/or in a direction away from the substrate 144) from the die package(s) 102, 202.

Given the tight spacing between die packages often employed in die package systems, cooling the systems becomes difficult. In the present application, a cooling system is presented that permits improved temperature management in die package systems having compact configurations (the technology presented herein may also be used in less compact systems).

Figure 6:
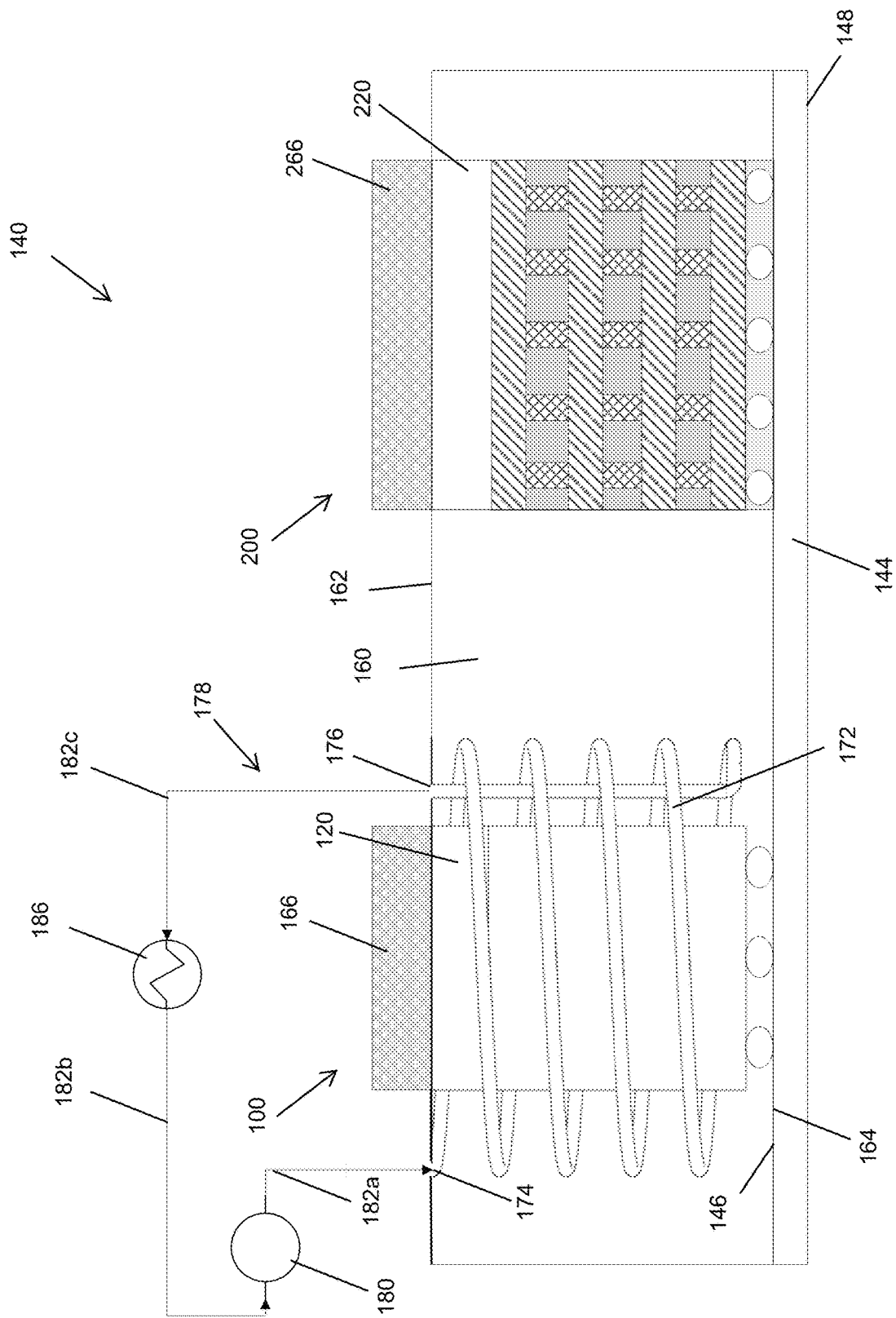
FIG. 6 is a front view of the die package system of FIG. 5, with a fluid management system illustrated schematically.

FIG. 6 illustrates the die package system 140 after a cooling channel 170 is formed near the first die package assembly 100. The cooling channel 170 is formed via removal of the sacrificial member 104 from the encapsulant 160. Removal of the sacrificial member 104 can be performed via different methods. These methods may be informed by the material composition of the sacrificial member 104 and/or of the encapsulant 160. For example, for dissolvable sacrificial members 104, water or other solutions may be introduced to the sacrificial member 104 to dissolve the sacrificial member 104. In such embodiments, all portions of the sacrificial member 104 may be dissolved, both inside and outside of the encapsulant 160. Sacrificial materials appropriate for dissolving include, but are not limited to, salt, glucose, and/or some other dissolvable material or combination of materials. In some embodiments, the sacrificial member 104 may be removed using chemical etching. Sacrificial member materials appropriate for chemical etching can include, for example, copper, aluminum, polymers (e.g., phenol or epoxy-based polymers), and/or some other material or combination of materials appropriate for chemical etching. In some embodiments, the sacrificial member 104 is constructed from a material with a melting point lower than temperature harmful to the encapsulant 160 and/or to the components of the die package(s). In some embodiments, the sacrificial member 104 is constructed from a material (e.g., a brittle material) that can be removed via vibrations introduced to the die package system 140.

As illustrated, removal of the sacrificial member 104 leaves a cavity 172 in the encapsulant 160 and/or other portion of the die package system 140. The cavity 172 has a size and shape similar or identical to the size and shape of the sacrificial member 104. The places at which the sacrificial member 104 exited to the encapsulant 160 become openings to the cavity 172. For example, as illustrated in FIG. 6, a first opening 174 and a second opening 176 are left behind by the removal of the sacrificial member 104. In the illustrated embodiment, the first and second openings 174, 176 are in the upper surface 162 of the encapsulant 160. In some embodiments, one or more openings are located through lateral surfaces of the encapsulant 160 in addition to or instead of openings in the upper surface 162.

The die package system 140 can include a fluid management system 178. The fluid management system 178 can be configured to move fluid through the cavity 172. Movement of fluid through the cavity 172 can facilitate efficient heat transfer from the die package(s) 102, 202 to an exterior of the die package system 140. In some embodiments, the fluid management system 178 includes a pump 180 or other fluid flow device connected to one or more of the openings 174, 176. For example, a fluid line 182a may connect the pump 180 to the first opening 174. The pump 180 can be configured to move fluid into and/or out from the encapsulant 160 through the openings 174, 176. In some embodiments, the pump 180 includes bellows, rotors, and/or other pump components.

In some embodiments, the fluid management system 178 includes a heat exchanger 186. The heat exchanger 186 can be in fluid communication with one, some, or all of the openings 174, 176 and pump 180. The heat exchanger 186 can be, for example, a shell and tube heat exchanger, a plate heat exchanger, and/or some other heat exchanger. The heat exchanger 186 can be configured to remove heat from the fluid pumped out of the die package system 140 (e.g., out of the encapsulant). The pump 180 can be configured to pump fluid from the cavity 172, to the heat exchanger 186, and back to the cavity 172. Fluid may be passed between the cavity 172, pump 180, and heat exchanger 186 via various fluid lines 182a, 182b, 182c (collectively, "fluid lines 182"). In the illustrated embodiment, the direction of fluid flow is indicated as coming from the cavity 172, to the heat exchanger 186, to the pump 180, and back to the cavity 172. This direction of flow may be reversed. In some embodiments, additional pumps and/or heat exchangers may be utilized.

Preferably, the fluid management system 178 is a closed system. For example, the cavity 172, pump(s) 180, heat exchanger(s) 186, fluid line(s) 180 can be a closed loop without outside fluid access. Maintaining the fluid management system 178 as a closed system can reduce the risk of contamination of the cavity 172 or other components with pollutants (e.g., particulates and/or undesirably fluids). In some embodiments, the fluid lines 180 and/or cavity 172 have small cross-sectional areas. In such embodiments, maintaining a closed system can reduce the risk that the fluid lines 180 and/or cavity 172 become clogged.

Preferably, the fluid used in the fluid management system 178 can efficiently transferring heat from the die package system 140. The fluid can be, for example, a refrigerant, water, gas, a hydrocarbon fluid, glycol, a glycol-water mixture, silicon oil, and/or some other liquid, gas, or combination of liquid(s) and gas(es). In some embodiments, the fluid has a low viscosity and/or is non-corrosive.

Figure 7:
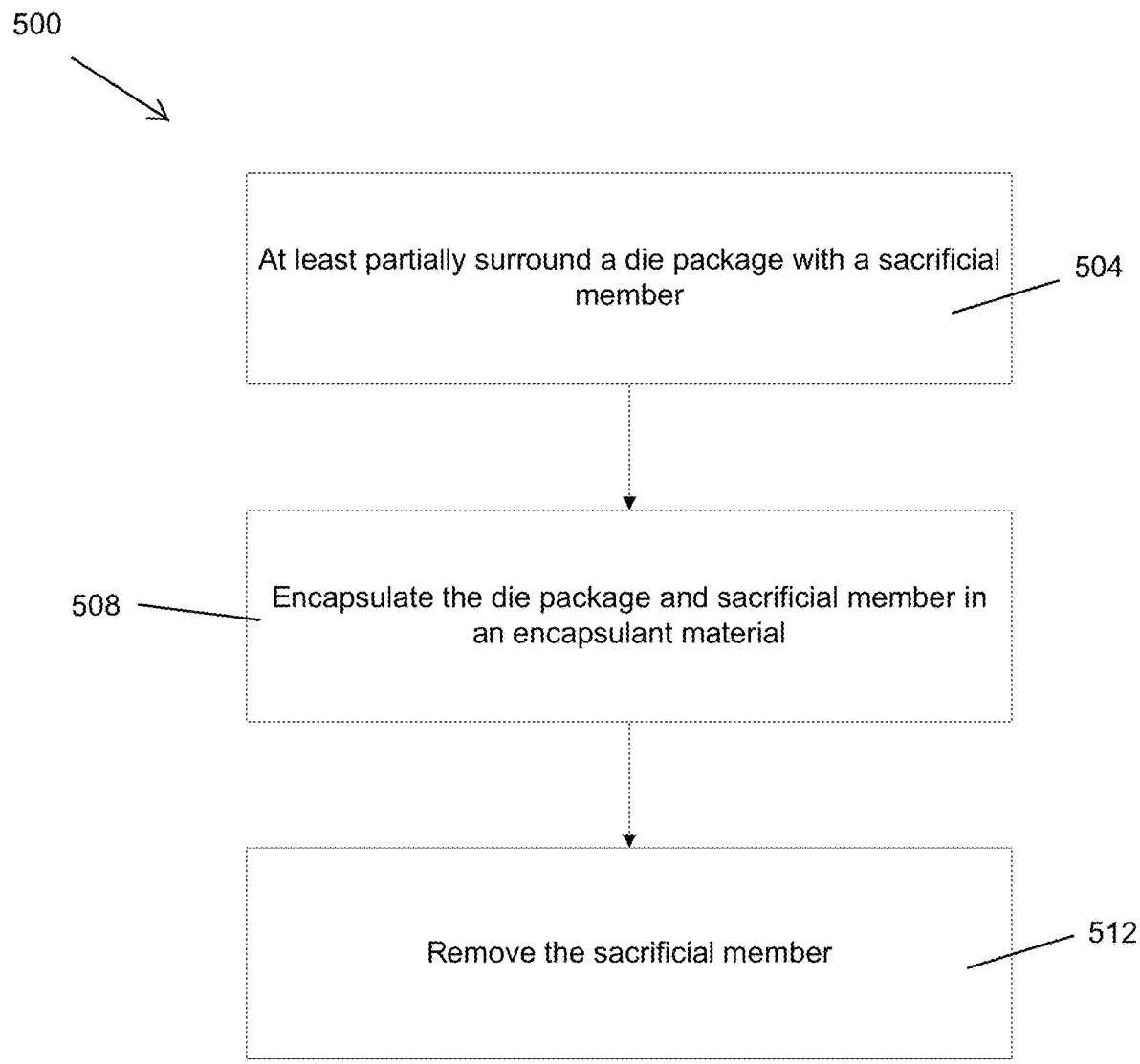
FIG. 7 is a flowchart illustrating an embodiment of a method of manufacturing a semiconductor device.

FIG. 7 is a flow chart of an embodiment of a method 500 for manufacturing a semiconductor device. The method 500 can include at least partially surrounding a die package with a sacrificial member (block 504). In some embodiments, surrounding at least two sides of the die package comprises surrounding all lateral sides of the die package with the sacrificial member. The die package can have any or all of the features of the above-described die packages 102, 202. The sacrificial member can have any or all of the features of the above-described sacrificial member 104 or the below-described sacrificial members 204, 304. The method 500 can include connecting the die package to a substrate. In some embodiments, the method 500 includes connecting more than one die package to the substrate or to a plurality of substrates. In some such embodiments, the method 500 includes at least partially surrounding more than one die package with the sacrificial member or with more than one sacrificial member.

The method 500 can include encapsulating the die package(s) and sacrificial member(s) with an encapsulant material (block 508). The encapsulant material can have properties the same as or similar to those of the above-described encapsulant 160.

The method 500 can include removing the sacrificial member (block 512). Removing the sacrificial member can include removing all portions of the sacrificial member inside of and/or outside of the encapsulant. In some embodiments, removing the sacrificial member includes forming one or more cavities within the encapsulant. The one or more cavities can have properties the same as or similar to those of the above-described cavity 172. In some embodiments, removing the sacrificial member includes chemically etching, melting, dissolving, vaporizing, and/or shattering the sacrificial member.

In some embodiments, the method 500 includes connecting a fluid management system to the openings of the cavity. The fluid management system can have all or some of the features of the above-described fluid management system 178. For example, the method 500 can include connecting a pump to one or more openings of the cavity. The method 500 can include pumping fluid through cavity. In some embodiments, the method 500 includes pumping the fluid through a heat exchanger. The heat exchanger can have all or some of the features of the above-described heat exchanger 186. The method 500 can include connecting the heat exchanger to the fluid management system such that the heat exchanger is in fluid communication with one or more of the openings.

Figure 8:
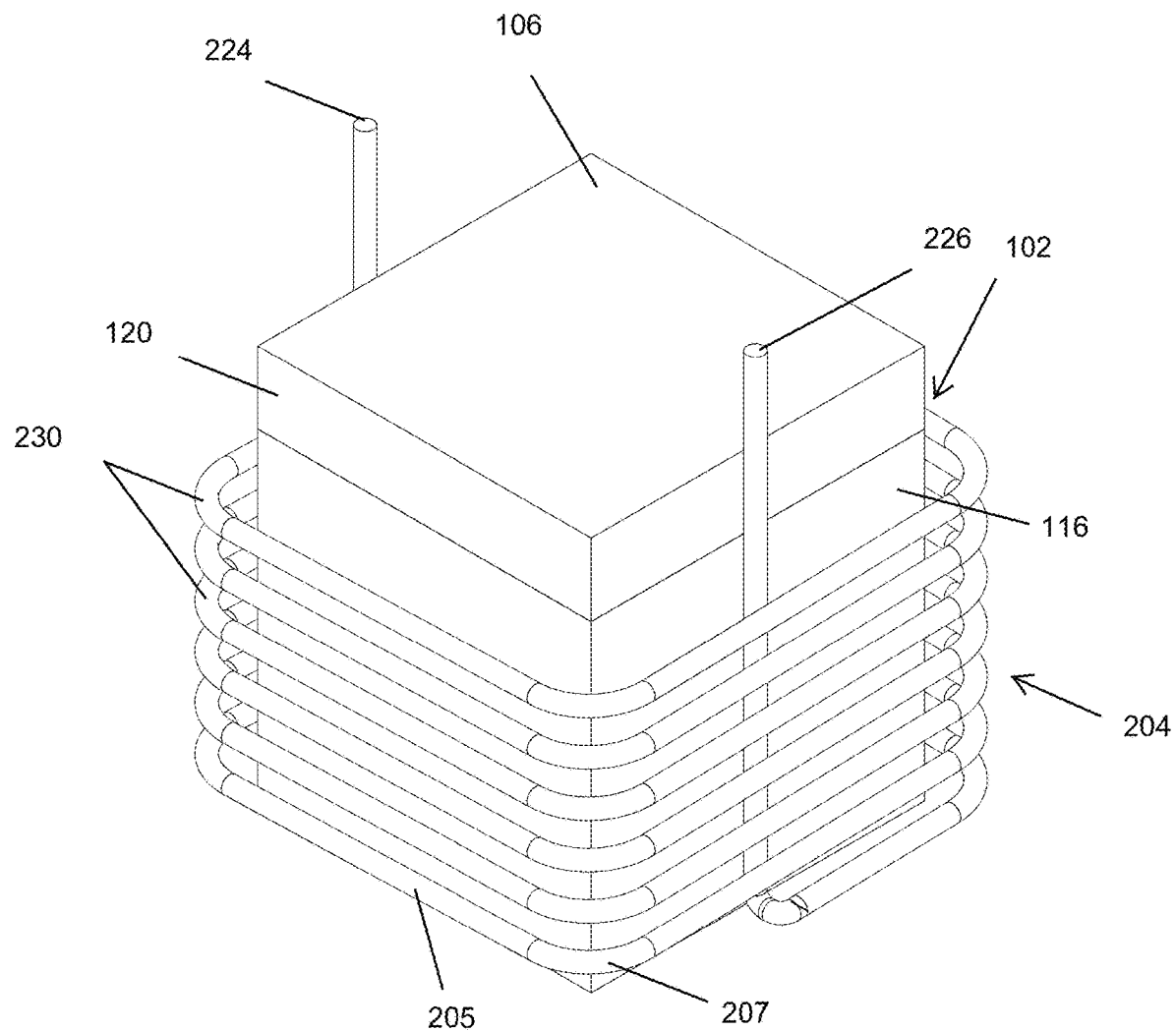
FIG. 8 is a perspective view of an embodiment of a die package assembly.
Figure 9:
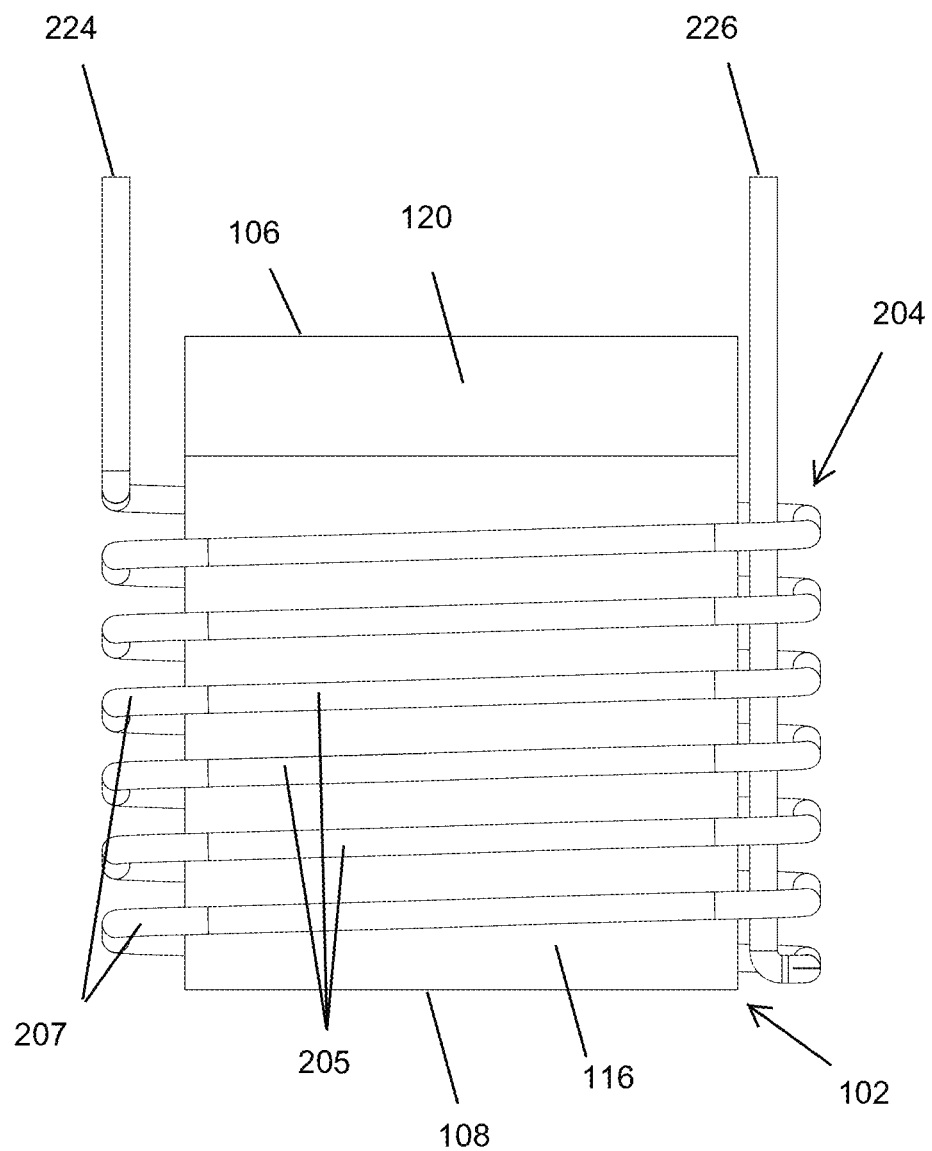
FIG. 9 is a front view of the die package assembly of FIG. 8.
Figure 10:
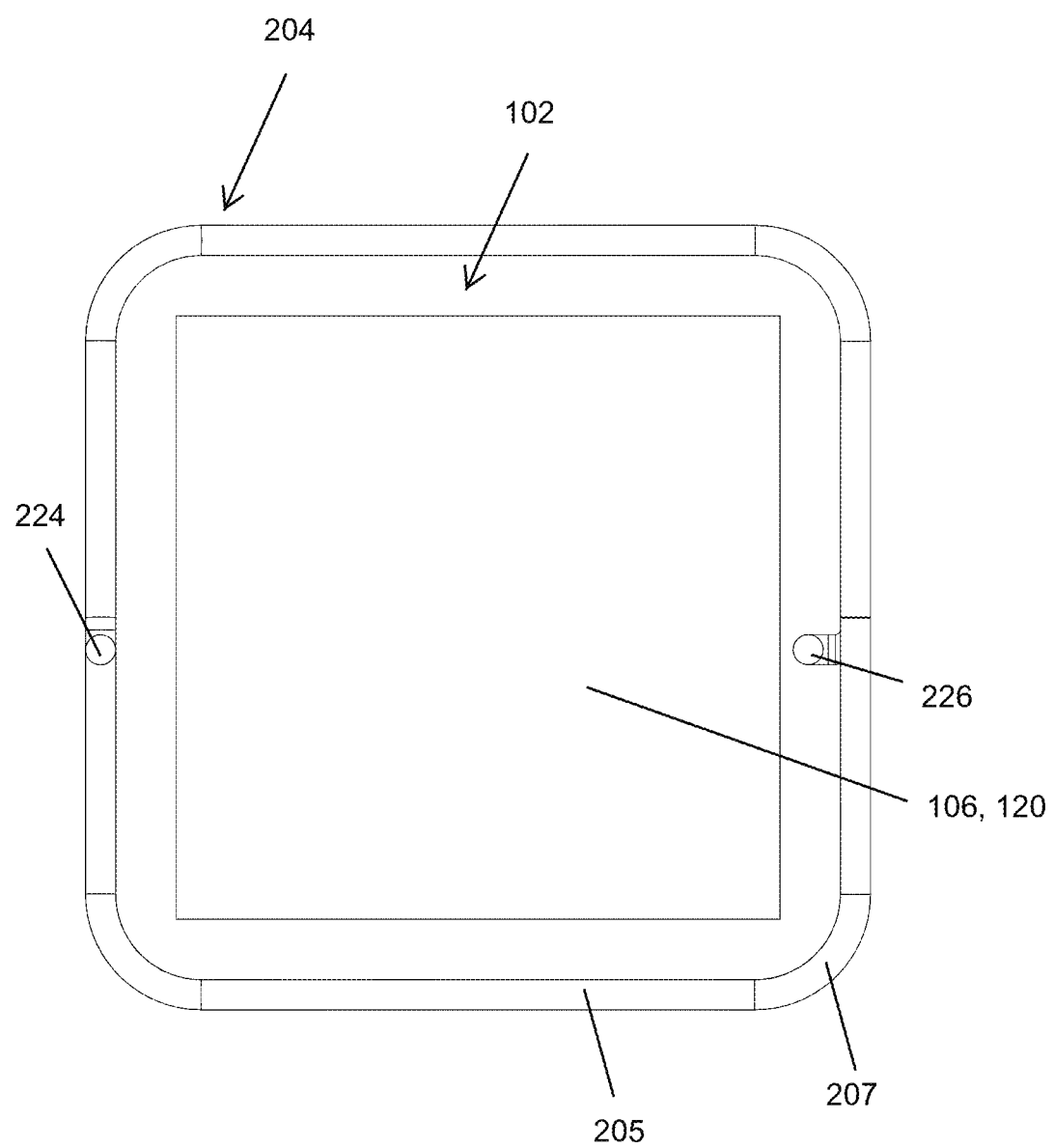
FIG. 10 is a top view of the die package assembly of FIG. 8.

FIGS. 8-10 illustrate an embodiment of a sacrificial member 204 at least partially surrounding a die package 102. The die package 102 can have some or all of the same features described above. As illustrated, the sacrificial member 204 can have a general coil shape formed from straight portions 205 connected to each other via corner portions 207. As illustrated in FIG. 10, the sacrificial member 204 can have a generally polygonal (e.g., square or rectangle) shape when viewed normal to the top side 106 of the die package 102.

Figure 11:
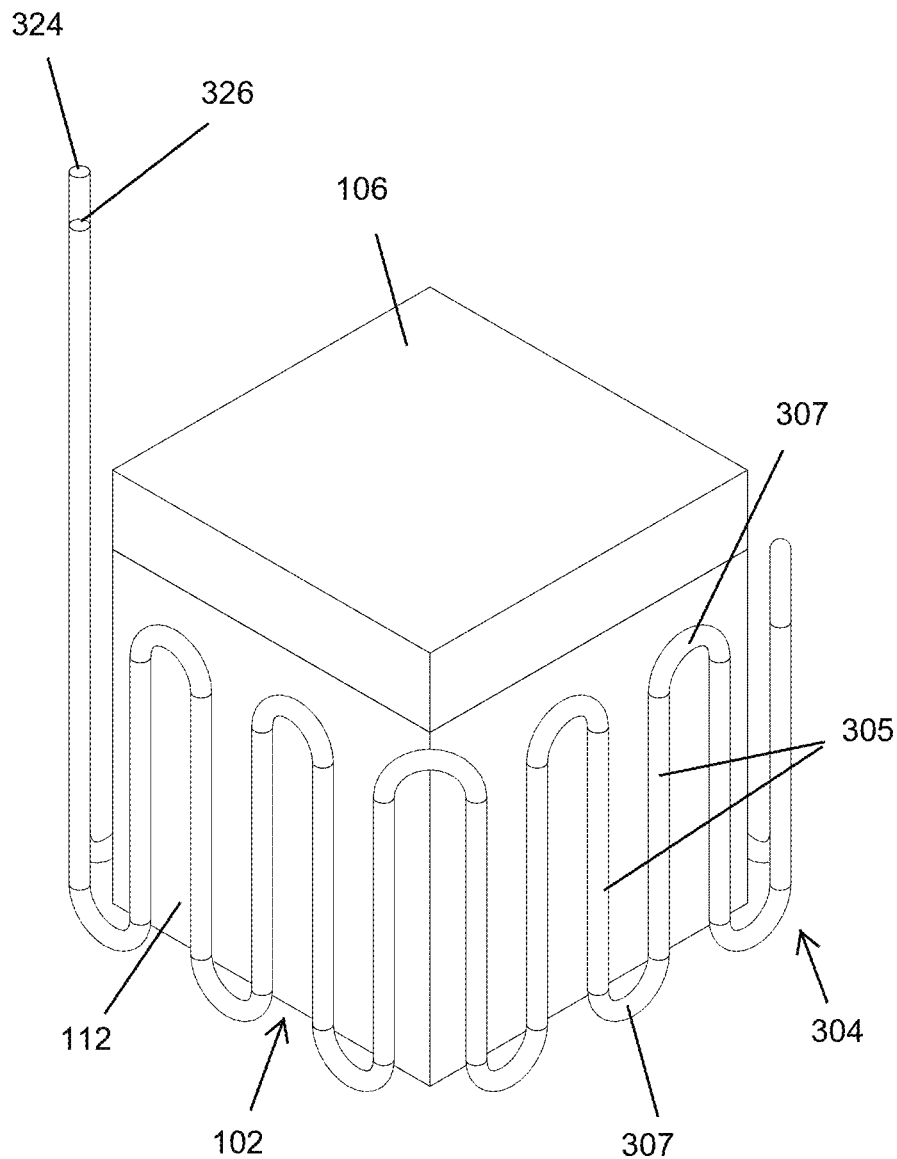
FIG. 11 is a perspective view of an embodiment of a die package assembly.
Figure 12:
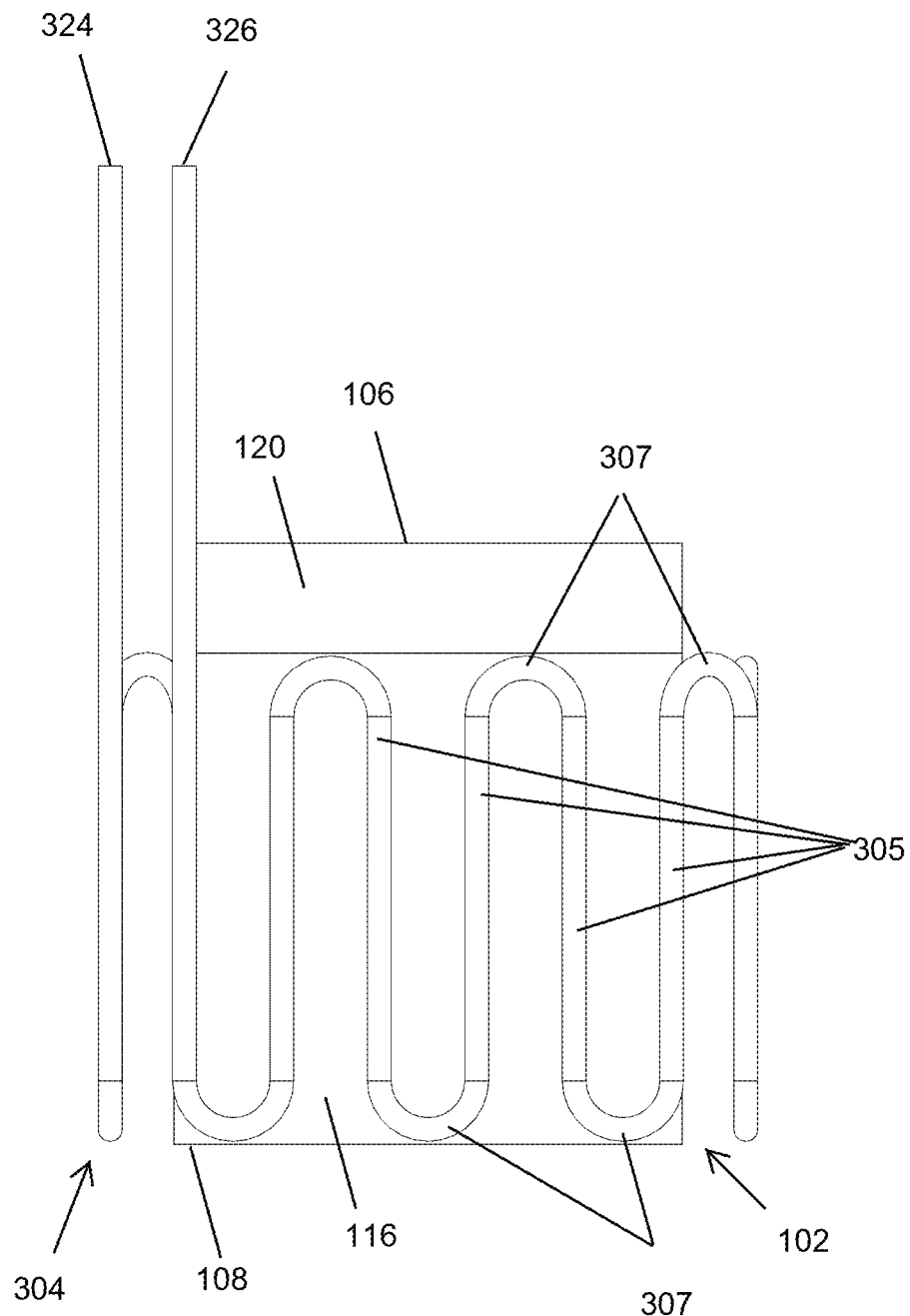
FIG. 12 is a front view of the die package assembly of FIG. 11.
Figure 13:
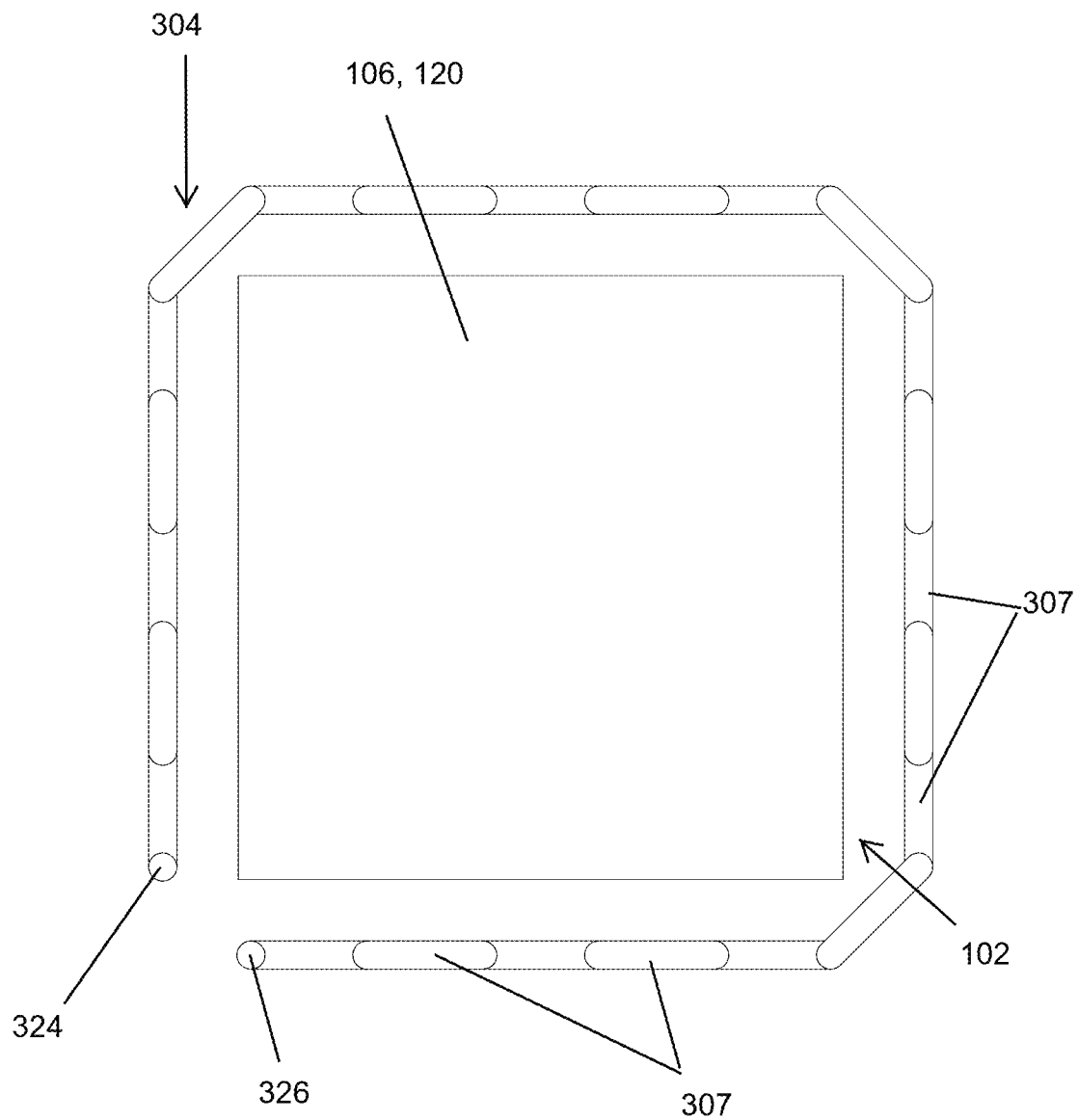
FIG. 13 is a top view of the die package assembly of FIG. 11.

FIGS. 11-13 illustrate an embodiment of a sacrificial member 304 at least partially surrounding a die package 102. The die package 102 can have some or all of the same features described above. As illustrated, the sacrificial member 304 can generally follow a wave or undulating pattern around all or a portion of the lateral sides 112 of the die package 102. In the illustrated example, the sacrificial member 304 includes vertical (e.g., in a direction normal to the top side 106 of the die package 102) segments 305 connected to each other via upper and lower turn portions 307. In some embodiments, the sacrificial member 304 includes horizontal (e.g., parallel to the bottom side 108 of the die package 102) segments connected to each other via lateral turn portions. In the illustrated example, the two ends 324, 326 of the sacrificial member 304 are adjacent each other. In some embodiments, the two ends 324, 326 are on different (e.g., opposite) sides of the die package 102 from each other. As illustrated in FIG. 13, the sacrificial member 304 can have a generally polygonal (e.g., square or rectangle) shape when viewed normal to the top side 106 of the die package 102. In some embodiments, the sacrificial member 304 has a generally rounded (e.g., circle or oval) shape when viewed normal to the top side 106 of the die package 102.

Figure 14:
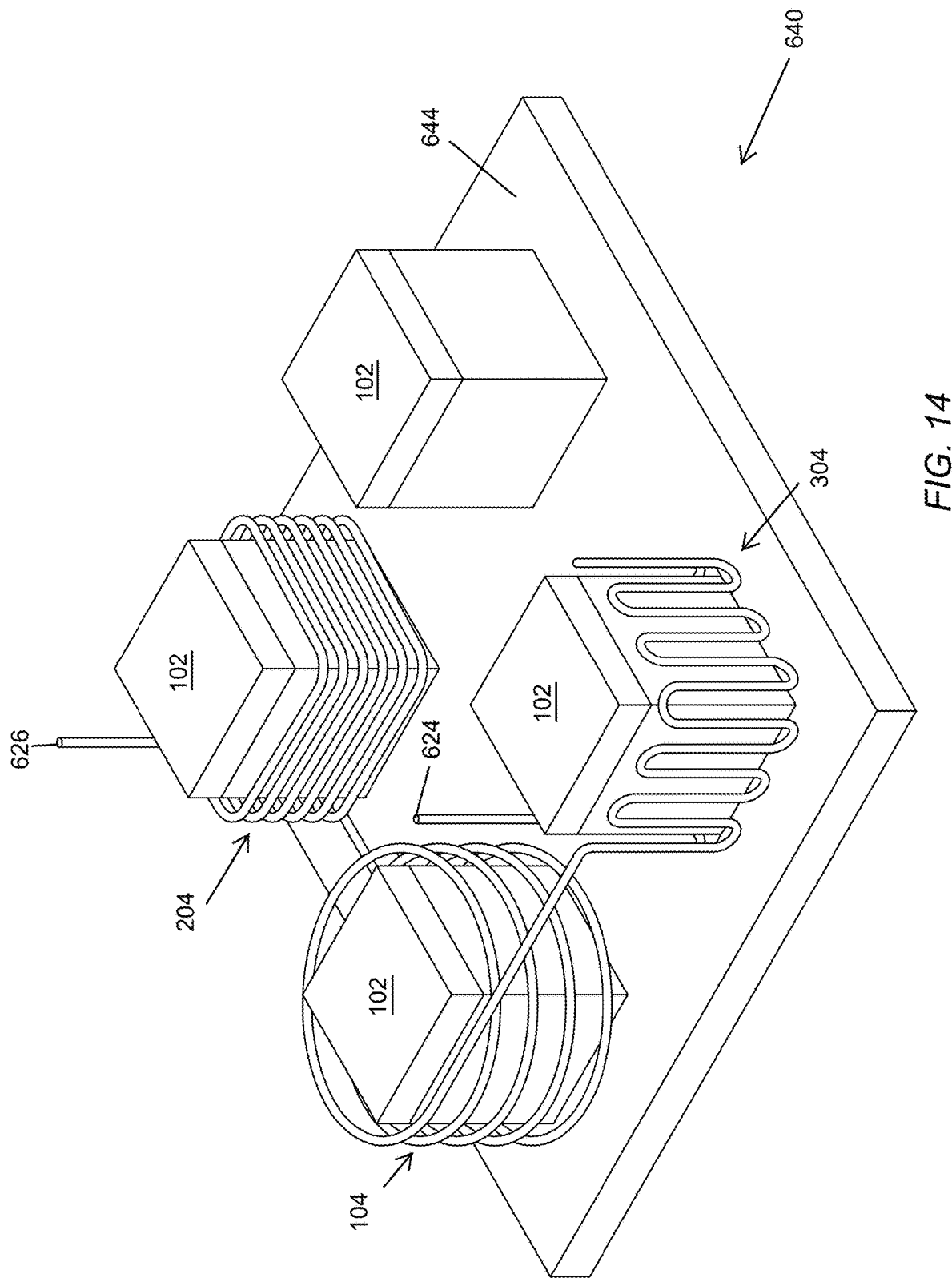
FIG. 14 is a perspective view of die package system incorporating the die package assemblies of FIGS. 1, 8, and 11.

In some embodiments, two or more of the sacrificial member 104, 204, 304 can be used in the same die package system 640. For example, as illustrated in FIG. 14, the die package system 640 can include one of each of the sacrificial members 104, 204, 304 surrounding respective die packages 102. In some embodiments, one or more die packages 102 of the system 640 are not surrounded by a sacrificial member. The system 640 can include one or more substrates 644 to which the die package(s) are connected. In some embodiments, each of the sacrificial members 104, 204, 304 include first and second ends. In the illustrated embodiment, the sacrificial members 104, 204, 304 are connected to each other to form one continuous sacrificial member having a first end 624 and a second end 626. In some embodiments, two or more, but fewer than all of the sacrificial members are connected to each other.

Figure 15:
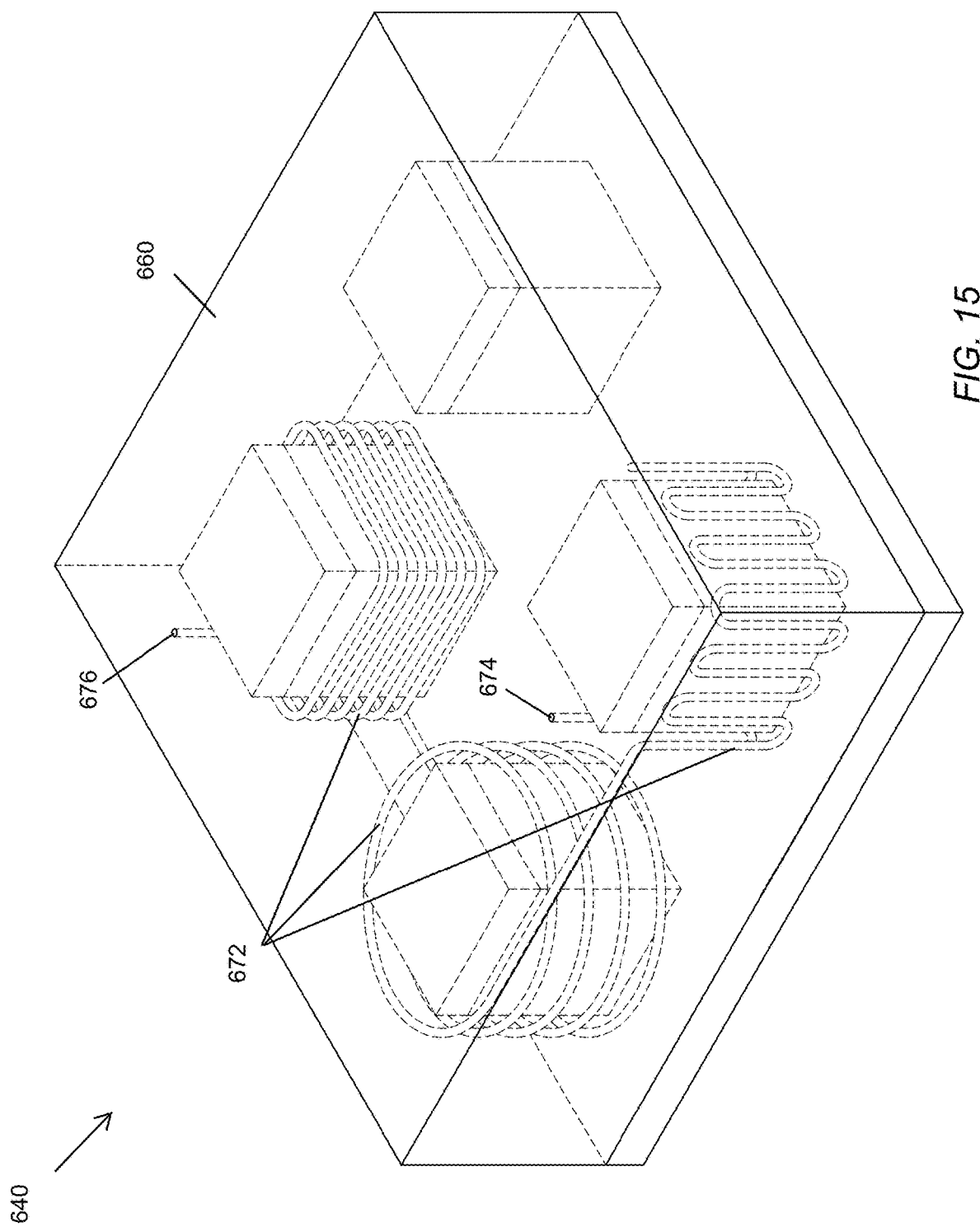
FIG. 15 is a perspective view of the die package system of FIG. 15, including an encapsulant and illustrating a cavity formed by removal of a sacrificial member.

FIG. 15 illustrates an embodiment of the die package system 640 after the encapsulant 660 is formed and the sacrificial members are removed. The resulting system 640 can include one or more openings 674, 676 to a cavity 672 formed by the removal of the sacrificial member(s). In some embodiments, a fluid management system similar to or the same as the fluid management system 178 described above can be connected to the openings 674, 676 to facilitate temperature management of the die package system 640.

Figure 16:
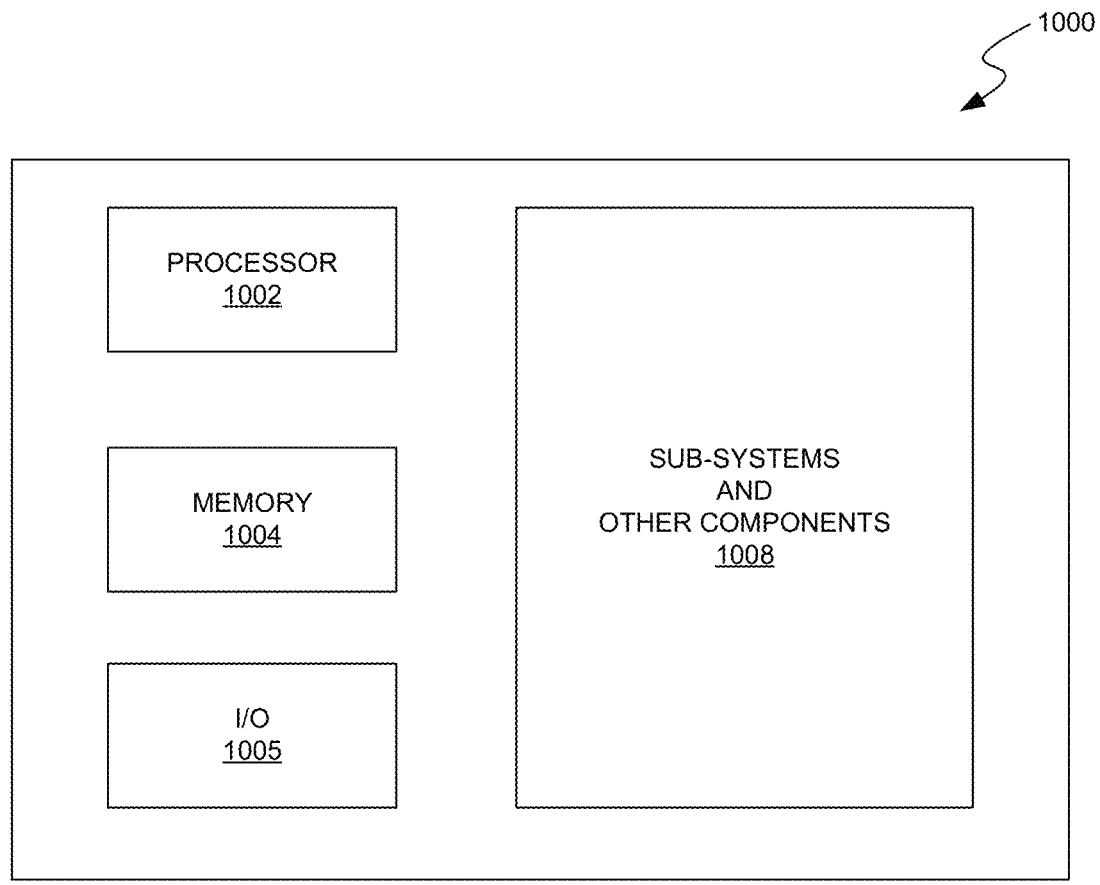
FIG. 16 is a schematic view showing a system that includes a semiconductor device in accordance with embodiments of the present technology.

Any one of the semiconductor devices having the features described above (e.g., with reference to FIGS. 1-15) can be incorporated into any of a myriad of larger and/or more complex systems, a representative example of which is system 1000 shown schematically in FIG. 16. The system 1000 can include a processor 1002, a memory 1004 (e.g., SRAM, DRAM, flash, and/or other memory devices), input/output devices 1005, and/or other subsystems or components 1008. The semiconductor dies and semiconductor die assemblies described above can be included in any of the elements shown in FIG. 16. The resulting system 1000 can be configured to perform any of a wide variety of suitable computing, processing, storage, sensing, imaging, and/or other functions. Accordingly, representative examples of the system 1000 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 1000 include lights, cameras, vehicles, etc. With regard to these and other examples, the system 1000 can be housed in a single unit or distributed over multiple interconnected units, e.g., through a communication network. The components of the system 1000 can accordingly include local and/or remote memory storage devices and any of a wide variety of suitable computer-readable media.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments may perform steps in a different order. Moreover, the various embodiments described herein may also be combined to provide further embodiments. Reference herein to "one embodiment," "an embodiment," or similar formulations means that a particular feature, structure, operation, or characteristic described in connection with the embodiment can be included in at least one embodiment of the present technology. Thus, the appearances of such phrases or formulations herein are not necessarily all referring to the same embodiment.

Certain aspects of the present technology may take the form of computer-executable instructions, including routines executed by a controller or other data processor. In some embodiments, a controller or other data processor is specifically programmed, configured, and/or constructed to perform one or more of these computer-executable instructions. Furthermore, some aspects of the present technology may take the form of data (e.g., non-transitory data) stored or distributed on computer-readable media, including magnetic or optically readable and/or removable computer discs as well as media distributed electronically over networks. Accordingly, data structures and transmissions of data particular to aspects of the present technology are encompassed within the scope of the present technology. The present technology also encompasses methods of both programming computer-readable media to perform particular steps and executing the steps.

Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms may also include the plural or singular term, respectively. Additionally, the term "comprising" is used throughout to mean including at least the recited feature(s) such that any greater number of the same feature and/or additional types of other features are not precluded. Directional terms, such as "upper," "lower," "front," "back," "vertical," and "horizontal," may be used herein to express and clarify the relationship between various elements. It should be understood that such terms do not denote absolute orientation. Further, while advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A method of manufacturing a semiconductor device, the method comprising:
   surrounding at least two sides of a die package with a sacrificial member;
   encapsulating the die package and sacrificial member in an encapsulant material; and
   removing the sacrificial member after encapsulating the die package and sacrificial member in the encapsulant material;
   wherein at least a portion of the encapsulant material is in contact with at least a portion of the die package after removing the sacrificial member.

2. The method of claim 1, wherein the sacrificial member surrounds the die package on at least three sides.

3. The method of claim 1, wherein surrounding at least two sides of the die package comprises surrounding all lateral sides of the die package with the sacrificial member.

4. The method of claim 3, wherein the sacrificial member is a coil.

5. The method of claim 1, further comprising pumping fluid through a cavity in the encapsulant formed by the removal of the sacrificial member.

6. The method of claim 1, wherein removing the sacrificial member results in a first opening to an exterior of the encapsulant material and a second opening to the exterior of the encapsulant material, wherein the first opening is in fluid communication with the second opening through the encapsulant material.

7. The method of claim 6, further comprising:
   connecting a fluid pump to the first opening such that the fluid pump is in fluid communication with the first opening; and
   pumping fluid into the encapsulant material through the one of first opening or the second opening and out from the encapsulant material through the other of the first opening or the second opening.

8. The method of claim 6, further comprising:
connecting a heat exchanger to the first opening or to the second opening; and
pumping the fluid from the heat exchanger to the first opening or to the second opening.

9. The method of claim 1, further comprising:
providing a substrate comprising a first surface and a second surface opposite the first surface; and
connecting the die package to the first surface of the substrate.

10. The method of claim 9, further comprising connecting a second die package to the first surface of the substrate.

11. A method of manufacturing a semiconductor device, the method comprising:
surrounding at least two sides of a die package with a sacrificial member, wherein at least a portion of the sacrificial member is spaced from the die package;
encapsulating the die package and sacrificial member in an encapsulant material; and
removing the sacrificial member via a non-mechanical removal process.

12. The method of claim 11, wherein the sacrificial member is an elongate structure with no branches or forks.

13. The method of claim 12, wherein removing the sacrificial member forms a cooling passage through the encapsulant material, and wherein the cooling passage has only one inlet and only one outlet into and out from the encapsulant material.

14. The method of claim 11, wherein surrounding at least two sides of a die package with a sacrificial member includes surrounding all lateral sides of the die package.

15. A semiconductor device assembly comprising:
a die package comprising:
a bottom side;
a top side; and
lateral sides extending between the top and bottom sides;
an encapsulant material encapsulating, molded over, and in contact with at least a portion of the die package; and
a cooling cavity in the encapsulant material, the cooling cavity comprising:
only one inlet into the encapsulant material;
only one outlet from the encapsulant material; and
an elongate channel extending without branches or forks from the inlet to the outlet;
wherein the elongate channel surrounds at least two lateral sides of the first die package.

16. The semiconductor device assembly of claim 15, wherein the elongate channel surrounds all lateral sides of the first die package.

17. The semiconductor device assembly of claim 16, wherein the elongate channel has a helical shape.

18. The semiconductor device assembly of claim 15, wherein both the inlet and the outlet of the cooling cavity are through a top surface of the encapsulant material.

19. The semiconductor device assembly of claim 15, wherein the cooling cavity extends along a majority of a height of the die package, as measured from the bottom side to the top side.

* * * * *